United States Patent [19]

Hong

[11] Patent Number: 5,510,288
[45] Date of Patent: Apr. 23, 1996

[54] BURIED BIT LINE MASK ROM PROCESS

[75] Inventor: Gary Hong, Hsinchu, Taiwan

[73] Assignee: United Microelectronics Corporation, Hsinchu, Taiwan

[21] Appl. No.: 375,782

[22] Filed: Jan. 20, 1995

[51] Int. Cl.[6] ................................. H01L 21/8246
[52] U.S. Cl. ................... 437/52; 437/45; 437/48
[58] Field of Search ................. 437/45, 48, 52, 437/69; 257/390, 391

[56] References Cited

U.S. PATENT DOCUMENTS

| | | | |
|---|---|---|---|
| 4,290,180 | 9/1981 | Kuo | 437/45 |
| 4,356,042 | 10/1982 | Gedaly et al. | 437/45 |
| 4,385,432 | 5/1983 | Kuo et al. | 437/45 |
| 5,418,175 | 5/1995 | Hsue et al. | 437/48 |

Primary Examiner—Tom Thomas
Attorney, Agent, or Firm—George O. Saile; Graham S. Jones, II

[57] ABSTRACT

A MOSFET device is formed on a lightly doped semiconductor substrate, starting by forming a first dielectric layer on the substrate; forming a mask with an array of openings therein over the dielectric layer, and forming thick silicon dioxide regions through openings in the mask. Dopant is ion implanted into the substrate through the mask between the thick silicon dioxide regions to form an array of buried bitline conductors. Perform an etch back through the mask of the thick silicon dioxide regions removing material to form channel openings in the thick silicon dioxide regions down to the substrate. Then deposit a gate oxide layer over the exposed substrate, forming a conformal array of conductors over the device extending down into the channel openings forming sidewalls therein narrowing the channel openings. Then, form a ROM code mask over the device with a ROM code opening over one of the channel openings; and ion implant dopant into the ROM code opening.

20 Claims, 4 Drawing Sheets

BURIED BIT LINE MASK ROM PROCESS

BACKGROUND OF THE INVENTION

1. Field of the Invention

This invention relates to semiconductor memories and more particularly to MASK ROM memories and a method of manufacture thereof.

2. Description of Related Art

U.S. Pat. No. 5,308,777 of Hong for "An Improved Mask ROM Process" states as follows:

"This process with the nitride spacer . . . narrows the code implant opening further. However, the poly 2 deposit narrows the code implant to a degree approximating a sufficient amount. Accordingly, in that case, the nitride spacer . . . is optional."

In addition, the Hong U.S. Pat. No. 5,308,777 states as follows:

"The photoresist . . . is formed into a mask with an opening . . . above the channel . . . An ion implant . . . of boron B+ ions is implanted into the opening . . . The chemical species of the dopant implanted is boron with a dose between about $7 \times 10^{13}/cm^2$ and about $2 \times 10^{14}/cm^2$, at an energy of about 100 keV. At the end of the ion implantation, the resist is removed."

"By combining the nitride spacer . . . and the poly 2 structure . . . , a self aligned smaller ROM code opening is provided for implanting of boron."

Commonly assigned U.S. patent application Ser. No. 08/289649 of C. H. Hsu et al for "Surface Breakdown Reduction by Counter-doped Island in Power MOSFET", filed on Aug. 12, 1994 describes forming a power transistor through an etched opening in a FOX region.

SUMMARY OF THE INVENTION

An object of this invention is to solve the problems of conventional mask ROM devices with buried bit lines and methods of manufacture thereof, which have low punch-through voltages, high bitline resistance and low source/drain (S/D) junction breakdown voltage, when the cell size is shrunk for high density products.

With this invention use is made of a silicon nitride mask over the bird's beak area to etch thick oxide as a self-aligned mask to create the channel area. Later the bird's beak area together with the polysilicon word line serves as a self-aligned mask for ROM code implanting, which prevents the, ROM code implant P+ dose from going into the buried bit line N+ S/D area. Therefore, low N+ resistance, low junction capacitance and high junction breakdown voltage can be accomplished. In addition, this process creates a shallow N+ region near the channel region by using the self-aligned bird's beak oxide.

In accordance with this invention a method of fabricating an MOSFET device on a lightly doped semiconductor substrate and the device manufactured thereby is provided. The method comprises fabricating an MOSFET device on a lightly doped semiconductor substrate starts with forming a first dielectric layer on the substrate, forming a masking layer with an array of openings therein over the dielectric layer, and forming thick silicon dioxide regions through the openings in the masking layer. Ion implant dopant into the substrate through the masking layer between the thick silicon dioxide regions forming an array of buried conductors therein. Then perform an anisotropic etch back through the masking layer of the thick silicon dioxide regions to form channel openings in the thick silicon dioxide regions down to expose the surface of the substrate. Form a gate oxide layer over the substrate where exposed by the etch back. Form a conformal array of conductors over the device extending down into the channel openings forming sidewalls therein narrowing the channel openings. Then, form a ROM code mask over the device with a ROM code opening over one of the channel openings. Ion implant dopant into the ROM code opening.

Preferably, the thick silicon dioxide regions have an overall thickness between about 3,000 Å and about 10,000 Å. The masking layer comprises silicon nitride. The buried conductors are formed by ion implanting phosphorous N+ dopant with an energy between about 60 keV and about 120 keV, and a dose within a range of doses between about $5 \times 10^{14}$ atoms/$cm^2$ and about $5 \times 10^{15}$ atoms/$cm^2$. Preferably, the buried conductors comprise buried bit lines implanted into the substrate with phosphorus (P) N+ dopant with an energy of about 100 keV, and a dose of P of about $2 \times 10^{15}/cm^2$. The gate oxide is between about 60 Å and about 200 Å thick. The conformal conductors have a thickness between about 1,000 Å and about 5,000Å. The thick silicon dioxide regions are about 6,000 Å in overall thickness.

In accordance with another aspect of the method of this invention, a MOSFET device is fabricated on a lightly doped semiconductor substrate is provided with the following steps by the following process steps. Form a first dielectric layer on the substrate, over the first dielectric layer form a masking layer with an array of openings therein. Form thick silicon dioxide regions through the openings in the masking layer. Ion implant dopant into the substrate through the masking layer between the thick silicon dioxide regions forming an array of buried bit lines with source/drain conductors therein. Perform an anisotropic etch back through the masking layer of the thick silicon dioxide regions to form channel openings in the thick silicon dioxide regions down to expose the surface of the substrate. Form a gate oxide layer over the substrate where exposed by the etch back. Form a conformal array of word line conductors over the device extending down into the channel openings forming sidewalls therein narrowing the channel openings. Form a ROM code mask over the device with a ROM code opening over one of the channel openings. Then, ion implant dopant into the ROM code opening.

Preferably, the thick silicon dioxide regions have an overall thickness between about 3,000 Å and about 10,000Å. The masking layer comprises silicon nitride. The buried conductors are formed by ion implanting phosphorous N+ dopant with an energy between about 60 keV and about 120 keV, and a dose within a range of doses between about $5 \times 10^{14}$ atoms/$cm^2$ and about $5 \times 10^{15}$ atoms/$cm^2$. The conformal conductors have a thickness between about 1,000 Å and about 5,000Å. The gate oxide has a thickness between about 60 Å and about 200 Å formed by thermal oxidation performed at a temperature between about 800° C. and about 900° C. The buried conductors comprise buried bit lines implanted into the substrate with phosphorus (P) N+ dopant with an energy of about 100 keV, and a dose of P of about $2 \times 10^{15}/cm^2$. The thick silicon dioxide regions have an overall thickness of about 6,000 Å. The conformal conductors have a thickness between about 1,000 Å and about 5,000 Å.

With respect to devices made in accordance with this invention, a MOSFET device on a lightly doped semiconductor substrate Is provided. A first dielectric layer is formed on the substrate. Thick silicon dioxide regions are formed on the substrate with channel openings therebetween. There is ion implanted dopant in the substrate between the thick silicon dioxide regions away from the channel openings. The ion implanted dopant forms an array of buried conductors therein. A gate oxide layer covers the substrate in the channel openings. A conformal array of conductors is formed over the device extending down into the channel openings, forming sidewalls therein narrowing the channel openings. A ROM code of ion implanted dopant is formed in a space self-aligned by the conformal conductors.

Preferably, the thick silicon dioxide regions have an overall thickness between about 3,000 Å and about 10,000 Å. The buried conductors comprise phosphorous N+ dopant ion regions implanted to a depth of about 0.1 µm and about 0.4 µm with a concentration between about $5 \times 10^{19}$ atoms/cm$^3$ and about $1 \times 10^{21}$ atoms/cm$^3$. The buried conductors comprise buried bit lines implanted into the substrate with N+ phosphorus (P) dopant with an energy of about 100 keV, and a dose of P of about $2 \times 10^{15}$/cm$^2$. The thick silicon dioxide regions have an overall thickness of about 6,000 Å. The gate oxide has a thickness between about 60 Å and about 200 Å. The conformal conductors have a thickness between about 1,000 Å and about 5,000 Å.

In accordance with another aspect of this invention, a MOSFET device is formed on a lightly doped semiconductor substrate with a first dielectric layer formed on the substrate. Thick silicon dioxide regions are formed on the first dielectric layer with channel openings therebetween. Dopant is ion implanted into the substrate between the thick silicon dioxide regions away from the channel openings, with the ion implanted dopant forming an array of buried bit line conductors in the substrate. A gate oxide layer overlies the substrate in the channel openings. A conformal array of word line conductors is formed over the device extending down into the channel openings forming sidewalls therein narrowing the channel openings. A ROM code ion implanted dopant region is formed in a space self-aligned by the conformal conductors.

Preferably, the thick silicon dioxide regions are between about 3,000 Å and about 10,000 Å in overall thickness. The buried conductors comprise phosphorous N+ dopant ion implanted to a depth of about 0.1 µm and about 0.4 µm with a concentration between about $5 \times 10^{19}$ atoms/cm$^3$ and about $1 \times 10^{21}$ atoms/cm$^3$. The gate oxide is between about 60 Å and about 200 Å thick. Conformal conductors have a thickness between about 1,000 Å and about 5,000 Å. The buried conductors comprise ion implanted buried bit lines implanted into the substrate with phosphorus (P) N+ with a dose between about $5 \times 10^{14}$ atoms/cm$^2$ and about $5 \times 10^{15}$ atoms/cm$^2$ at an energy between about 60 keV and about 120 keV dopant; and preferably with an energy of about 100 keV, and a dose of P of about $2 \times 10^{15}$/cm$^2$. The thick silicon dioxide regions have an overall thickness between about 3,000 Å and about 10,000 Å in overall thickness, the thick silicon dioxide regions extending between about 1,500 Å and about 5,000 Å into the substrate. It is preferred that the thick silicon dioxide regions have an overall thickness of about 6,000 Å.

BRIEF DESCRIPTION OF THE DRAWINGS

The foregoing and other aspects and advantages of this invention are explained and described below with reference to the accompanying drawings, in which:

FIG. 2 is sectional view taken generally along line 2—2' in FIG. 1.

DESCRIPTION OF THE PREFERRED EMBODIMENT

Figure 1:
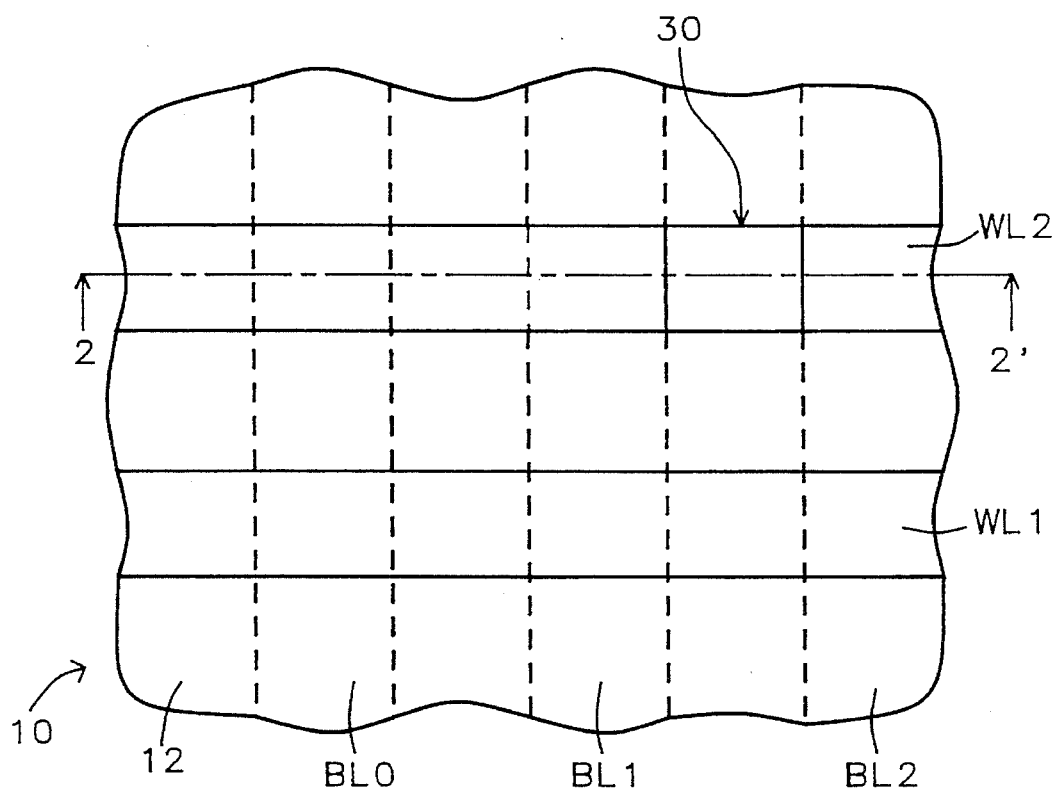
FIG. 1 shows a plan view of a fragment of a device with buried bit lines BL1 and BL2 which are part of an array of parallel bit lines BL0, BL1, BL2 .... BLn and an array of word lines WL1, WL2 ... WLn overlying the surface of the device, extending at right angles to the bit lines, and an opening comprising a ROM code mask.

FIG. 1 shows a plan view of a fragment of a device 10 with buried bit lines BL1 and BL2 which are part of an array of parallel bit lines BL0, BL1, BL2 ... BLn and a parallel array of word lines WL1 and WL2 of an array of word lines WL1, WL2 .... WLn (orthogonally directed relative to the bit line array) overlying the surface of device 10, extending at right angles to the bit lines. An opening 30 comprising a ROM code mask is shown.

Figure 2:
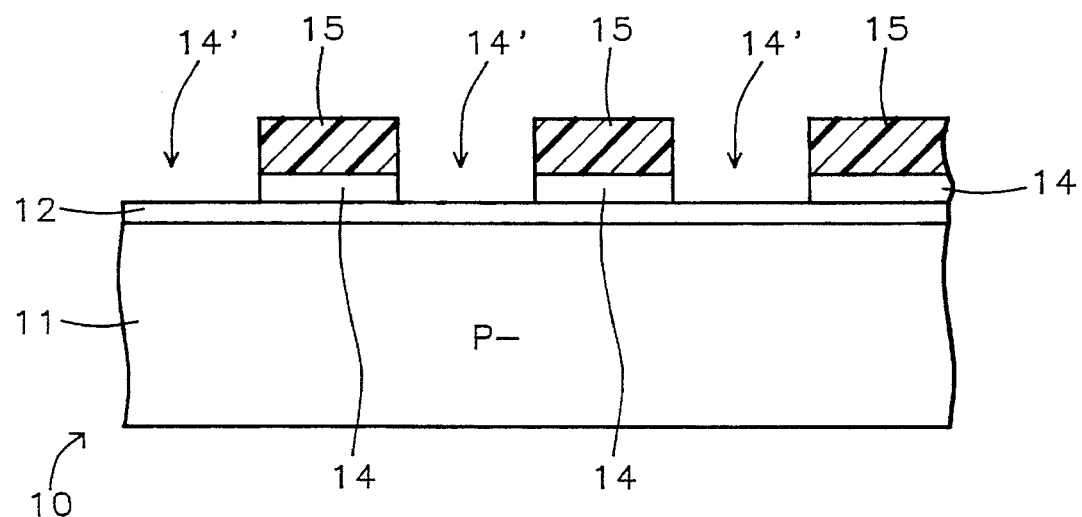
FIG. 2 shows an early stage in the manufacture of the device of FIG. 1.

Referring to FIG. 2, an early stage in the manufacture of the device 10 of FIG. 1 is shown. FIG. 2 is sectional view taken generally along line 2—2' in FIG. 1. Device 10 is formed on a silicon semiconductor substrate/device 11 that incorporates a first dopant for semiconductors, preferably in a concentration between about $1 \times 10^{14}$ atoms/cm$^3$ and $1 \times 10^{16}$ atoms/cm$^3$. The substrate is preferably monocrystalline silicon, although polycrystalline silicon, III–V compound semiconductors, silicon on insulator, (SOI) silicon on sapphire (SOS) etc. could possibly be utilized. The dopant, which is preferably P–, can be either P or N, depending upon the type of MOSFET desired to be made as is well understood in the art.

PAD OXIDE

The surface of P– substrate 11 is oxidized by a conventional process to form a silicon dioxide pad oxide which is a stress relief thermal oxide layer 12. Pad oxide layer 12 is preferably about 300 Å thick. At the extremes, the pad oxide layer 12 has a thickness between about 100 Å and about 600 Å.

SILICON NITRIDE DEPOSITION

A blanket silicon nitride masking layer 14 is deposited preferably to a thickness of about 700 Å, and layer 14 has a thickness between about 200 Å and about 1500 Å.

MASK FOR THICK SILICON DIOXIDE AND BURIED BIT LINES

In the following step a conventional field oxide diffusion photoresist mask 15 with openings 14' therein is formed on silicon nitride layer 14 to provide a pattern for thick oxide regions 16 (shown in FIG. 3) to be formed. Subsequently regions 14 will form a silicon nitride self-aligned mask 14 for the buried bit lines 20 of the device 10, etc. The mask 14 is patterned by a conventional photolithographic process for the purpose of forming a conventional silicon nitride mask with the openings 14' for formation of a pattern of silicon dioxide structures 16 as stated above.

SILICON NITRIDE ETCHING

FIG. 2 shows silicon nitride layer 14 after etching through openings 14' in mask 15 down to pad oxide layer 12. Portions of the silicon nitride layer 14 are removed by using standard etching techniques to form mask 14 with channel openings 14' therethrough.

Then mask 15 is stripped.

FORMATION OF THICK OXIDE

Figure 3:
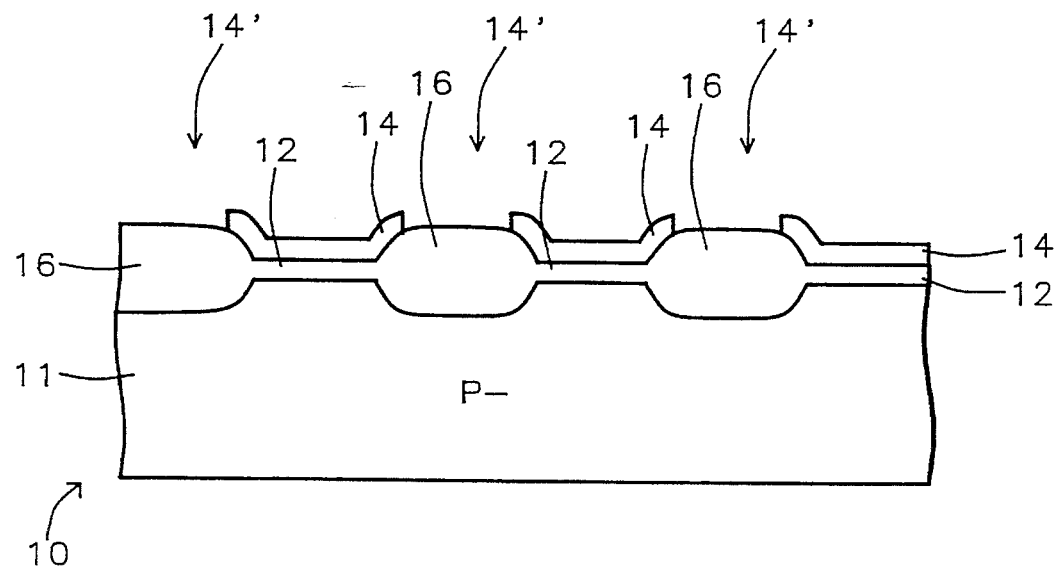
FIG. 3 shows a process of oxidation through openings in a silicon nitride masking layer forming a set of conventional field oxide (FOX) regions in the openings and therebelow near the surface of the substrate. The regions extend beneath the masking layer on the periphery of the openings therein.

In FIG. 3, the device of FIG. 2 is shown after a process of oxidation through channel openings 14' in silicon nitride masking layer 14 to form (by the oxidation process) a set of conventional field oxide (FOX) regions 16 (shown in FIG. 3) in the channel openings 14' and therebelow near the surface of the substrate 11. The thick silicon dioxide (FOX) regions 16 preferably have a overall thickness of about 6,000 Å. Regions 16 extend beneath the masking layer 14 on the periphery of the channel openings 14' therein.

The silicon dioxide regions 16 have an range of overall thicknesses between about 3,000 Å and about 10,000 Å. The silicon dioxide regions 16 extend between about 1,500 Å and about 5,000 Å into the substrate 11. The process used to form silicon dioxide (FOX) regions 16 is the well known LOCOS process which is performed on the material of substrate 11 through channel openings 14' by placing device 11 in an oxidizing ambient environment.

EXAMPLE

The thick silicon dioxide regions 16 are formed in an environment of $O_2$ and $H_2$ gases at between about 900° C. and about 1000° C. for between about 1 hour and about 5 hours.

BURIED N+ IMPLANT

Figure 4:
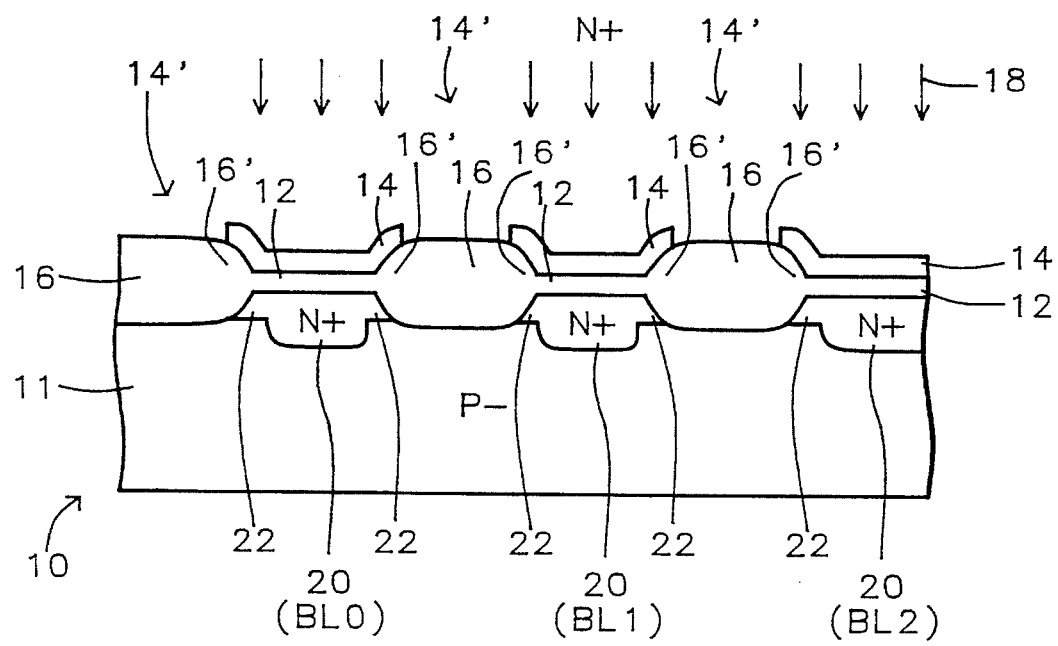
FIG. 4 shows formation of buried bit line regions by means of a buried N+ implant step.

FIG. 4 shows the device of FIG. 3 shown after formation of buried bit line regions 20 by means of a buried N+ implant step. Buried N+ ions 18 are introduced between thick oxide structures 16 into buried bit line regions 20 in substrate 11 by ion implanting between the newly formed, thick oxide structures 16. Buried bit line regions 20 serve as source/drain N+ regions. Preferably the process of ion implanting is performed with phosphorus (P) at an energy of about 100 keV with a dose of about $2\times10^{15}/cm^2$. The possible range of concentration ranges between about $5\times10^{19}$ atoms/$cm^3$ and about $1\times10^{21}$ atoms/$cm^3$ to a depth of about 0.1 μm and about 0.4 μm with a dopant applied by ion implanting of phosphorus ions with a dose between about $5\times10^{14}$ atoms/$cm^2$ and about $5\times10^{15}$ atoms/$cm^2$ at an energy between about 60 keV and about 120 keV.

Due to the bird's beak, shallow N+ junction regions 22 on the periphery of buried bit lines 20 are formed near the channel opening 14' in silicon nitride masking layer 14 in a self-aligned process.

CHANNEL ETCH

Figure 5:
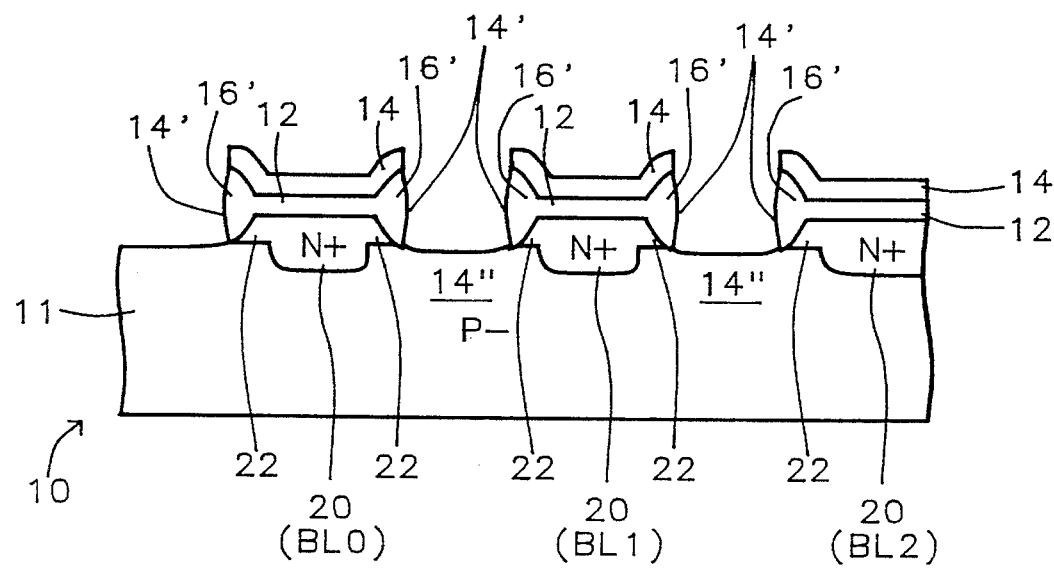
FIG. 5 shows a channel being etched in the thick silicon dioxide layer down to the substrate.

Referring to FIG. 5, the device of FIG. 4 is shown after a channel opening 14' is etched down through silicon nitride layer 14 and then down through the thick silicon dioxide layer 16 down to the surface of substrate 11 extending opening 14' down to substrate 11. The process of channel etching is performed using the silicon nitride masking layer 14, again, as a self-aligned etch mask for etching down through silicon dioxide regions 16 through openings 14'. As a result, silicon dioxide material 16 is removed from silicon dioxide regions 16 down to substrate 11 by means on a conventional, anisotropic etch back process to form openings 14'. During this anisotropic channel etching process, bird's beak portions 16' of silicon dioxide regions 16 remain intact, protected beneath the silicon nitride layer 14, because of protection by the silicon nitride self-aligned etch mask 14.

STRIPPING OF SILICON NITRIDE MASK

Figure 6:
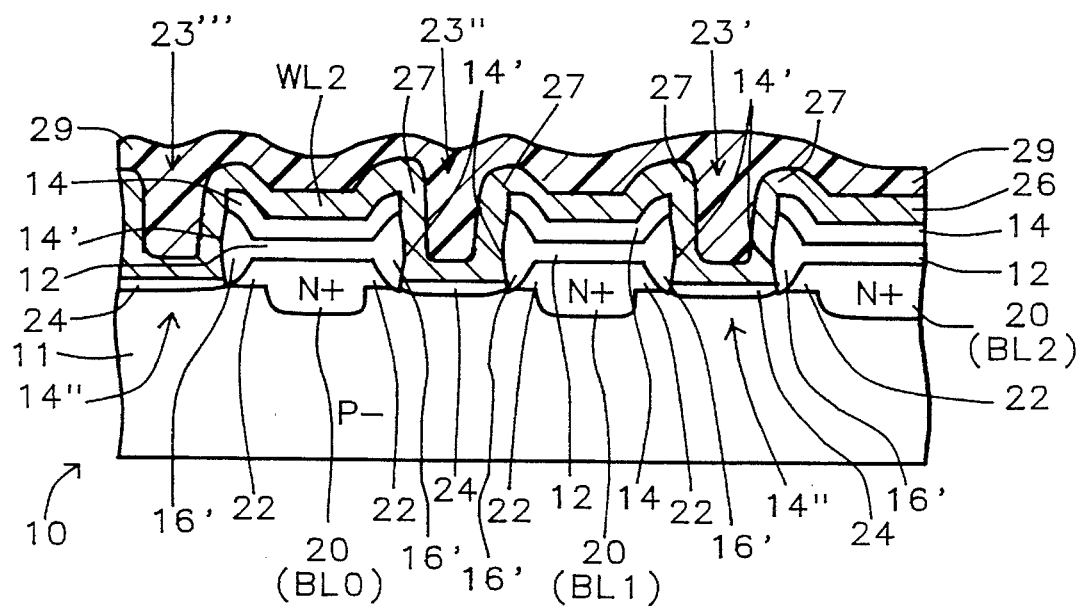
FIG. 6 shows the device of FIG. 5 after the silicon nitride Si$_3$N$_4$ mask is stripped. Then a gate oxide layer is grown in the base of the channel Just formed. Then a conformal blanket polysilicon word line layer is deposited, which extends down into the channel opening forming sidewall spacers which to be used as a self-aligned sidewall spacer for ion implanting in combination with a ROM code mask shown in FIG. 7. The polysilicon layer has been doped with a blanket doping, and a conventional process of word line masking with a photoresist mask is formed patterned with the conventional pattern of a parallel array of word lines WL1 and WL2 as shown in FIG. 1. The word lines WL1, WL2, etc. are then formed by etching through the openings in the mask which is then removed.

Referring to FIG. 6, the device 10 of FIG. 5 is shown after the silicon nitride $Si_3N_4$ masking layer 14 was stripped away from it, preferably by phosphoric acid ($H_3PO_4$) in a wet etch.

GATE OXIDE AND FIELD OXIDE GROWTH

Referring again to FIG. 6, after stripping masking layer 14, a gate oxide layer 24 is then grown by thermal oxidation over the newly exposed surface of substrate 11 of device 10 at the base of new channel 14". The gate oxide layer 24 preferably has a thickness of about 70 Å, within a range of thicknesses between about 60 Å and about 200 Å. The thermal oxidation is performed at a temperature between about 800° C. and about 900° C. The remainder of device 11 is covered by the remaining silicon dioxide regions 16 and pad oxide 12.

POLYSILICON WORD LINE DEPOSITION

Also, referring to FIG. 6, a conformal, blanket polysilicon word line layer 26 is deposited over the exposed surface of gate oxide layer 24 and over the base and side walls of the channel 14" as well as and the remainder of the exposed surfaces of device 10. Polysilicon word line layer 26 is deposited to a thickness between about 1,000 Å and about 5,000 Å by the conventional LPCVD (low pressure chemical vapor deposition) process. The word line layer 26 extends down into channel opening 14" forming sidewall spacers 27 which can be used as a self-aligned sidewall spacer for ion implanting (in combination with the ROM code mask 38 shown in FIG. 7.)

POLYSILICON WORD LINE DOPING

As shown in FIG. 6, the polysilicon layer 26 has been doped with a blanket doping. One way to dope layer 26 is by diffusion of phosphoryl chloride ($POCl_3$) at 900° C. for 20 minutes. Alternatively layer 26 can be doped with ion implanting of $P^{31}$ or As (arsenic) dopant applied with a dose between about $1\times10^{15}/cm^2$ and about $1\times10^{16}/cm^2$ and energies between about 20 keV and about 60 keV.

WORD LINE MASKING

A conventional process of word line masking with photoresist mask 29 shown in FIG. 6 is formed next. Mask 29 is patterned with the conventional pattern of a parallel array of word lines WL1 and WL2 as shown in FIG. 1. The word lines WL1, WL2, etc. are then formed by etching through the openings in the mask 29, and mask 29 is then removed.

ROM CODE MASKING

Figure 7:
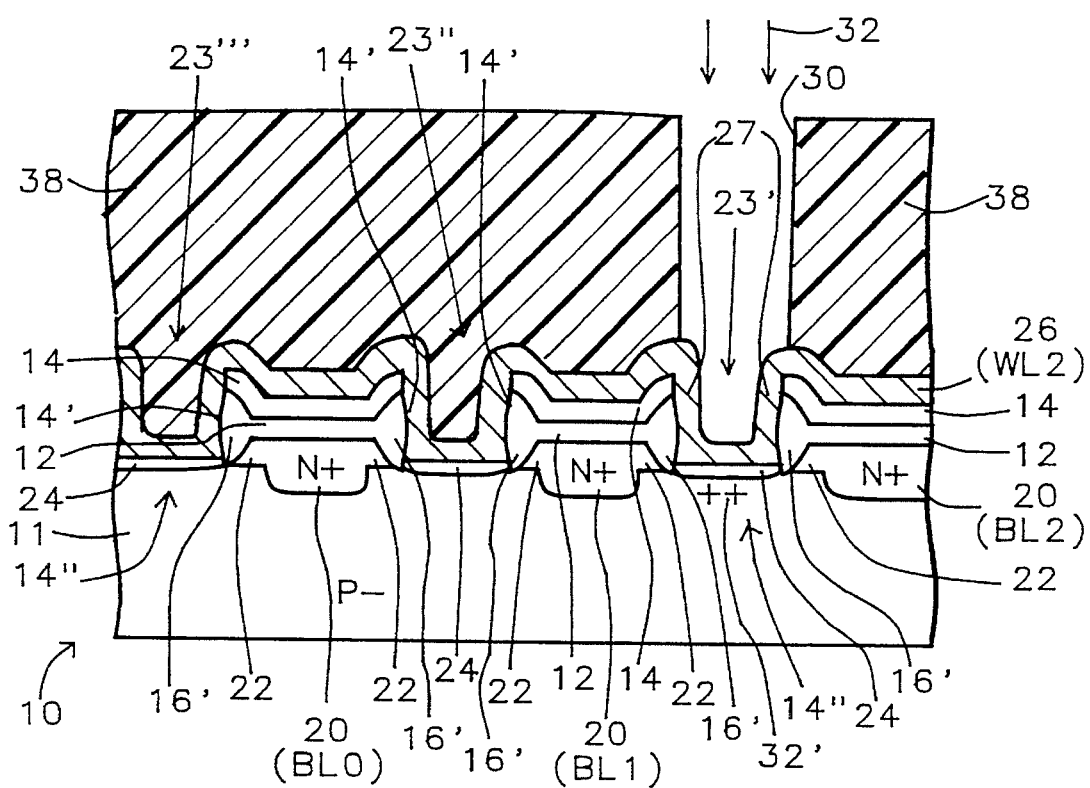
FIG. 7 shows the device of FIG. 6 after a photoresist mask has been formed to designate the opening for the code mask location into which a ROM code can be implanted in the next step.

Referring to FIG. 7, the FIG. 6 device 10 is shown after a ROM code photoresist mask 38 has been formed thereover for the purpose of designating with an opening 30 for the code mask location into which a ROM code can be implanted, next.

ROM CODE ION IMPLANT

ROM code boron ions 32 are implanted into the center part 23' of the channel 14" exposed by opening 30 in ROM code mask 38. The implant is self-aligned by polysilicon word line side wall spacers 27 on either side of center space 23'. The implanted boron can turn off the cell for programming but the boron ion will not contact N+ S/D region.

Preferably the implant 32 is performed with boron (B) ions 32 implanted at about 150 keV with a dose of about $1\times10^{14}/cm^2$. At the extreme limits the dose is between about $5\times10^{13}/cm^2$ and about $5\times10^{14}/cm^2$ within a range of energies between about 80 keV and about 200 keV.

SUMMARY

With this invention use is made of a silicon nitride mask 14 over the bird's beak area 16' to etch thick oxide 16 as a self-aligned mask to create the channel area 14" in substrate 11. Later the bird's beak area 16' together with the polysilicon word line 26 serves as a self-aligned mask for ROM code implanting, which prevents the ROM code implant P+ dose from going into the buried bit line N+ S/D area. Therefore, low N+ resistance, low junction capacitance and high junction breakdown voltage can be accomplished. In addition, this process creates a shallow N+ region near the channel region by using the self-aligned bird's beak oxide 16'.

In this device ROM code implants (boron) are implanted into the center part of the channel 14", in a self-aligned process, aligned by the polysilicon word line 26 and side wall spacers 27. The implanted boron 32' turns off the cell for programming but the boron ions 32' will not contact the N+ S/D regions because implanted ions are separated from the N+ regions by the side wall spacers 27 of the polysilicon word line 26. Therefore, lower capacitance and lower S/D resistance and higher junction breakdown voltage can be accomplished because the N+ regions will not contact with the implanted dose (ROM code), which is doped with heavier P-type boron ions. Also, the shallow N+ junction near channel region increases the punchthrough resistance for sub-micron devices.

Back end process

Conventional back end process steps follow.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating an MOSFET device on a lightly doped semiconductor substrate comprising, forming a first dielectric layer on said substrate, forming over said dielectric layer a masking layer with an array of openings therein, forming field oxide regions through said openings in said masking layer, ion implanting dopant into said substrate through said masking layer between said thick silicon dioxide regions forming an array of buried conductors therein, performing an anisotropic etch back through said masking layer of said field oxide regions to form channel openings in said field oxide regions down to expose the surface of said substrate, forming a gate oxide layer over said substrate where exposed by said etch back, forming a conformal array of conductors over said device extending down into said channel openings forming sidewalls therein narrowing said channel openings, forming a ROM code mask over said device with a ROM code opening over one of said channel openings, and ion implanting dopant into said ROM code opening.

2. A method in accordance with claim 1 where said field oxide regions have an overall thickness between about 3,000 Å and about 10,000 Å.

3. A method in accordance with claim 2 where said masking layer comprises silicon nitride.

4. A method in accordance with claim 1 wherein said buried conductors are formed by ion implanting phosphorous N+ dopant with an energy between about 60 keV and about 120 keV, and a dose within a range of doses between about $5\times10^{14}$ atoms/cm$^2$ and about $5\times10^{15}$ atoms/cm$^2$.

5. A method in accordance with claim 1 wherein said gate oxide is between about 60 Å and about 200 Å thick.

6. A method in accordance with claim 1 wherein said conformal conductors have a thickness between about 1,000 Å and about 5,000 Å.

7. A method in accordance with claim 6 wherein said gate oxide is between about 60 Å and about 200 Å thick.

8. A method in accordance with claim 4 wherein said buried conductors comprise buried bit lines are implanted into said substrate with phosphorus (P) N+ dopant with an energy of about 100 keV, and a dose of P of about $2\times10^{15}/cm^2$.

9. A method in accordance with claim 8 wherein said field oxide regions are about 6,000 Å in overall thickness.

10. A method in accordance with claim 9 wherein said conformal conductors are between about 1,000 Å and about 5,000 Å thick.

11. A method of fabricating an MOSFET device on a lightly doped semiconductor substrate comprising, forming a first dielectric layer on said substrate, forming over said first dielectric layer a masking layer with an array of openings therein, forming field oxide regions through said openings in said masking layer, ion implanting dopant into said substrate through said masking layer between said field oxide regions forming an array of buried bit lines with source/drain conductors therein, performing an anisotropic etch back through said masking layer of said field oxide regions to form channel openings in said field oxide regions down to expose the surface of said substrate, forming a gate oxide layer over said substrate where exposed by said etch back, forming a conformal array of word line conductors over said device extending down into said channel opening is forming sidewalls therein narrowing said channel openings, forming a ROM code mask over said device with a ROM code opening over one of said channel openings, and ion implanting dopant into said ROM code opening.

12. A method in accordance with claim 11 where said field oxide regions have an overall thickness between about 3,000 Å and about 10,000 Å.

13. A method in accordance with claim 12 where said masking layer comprises silicon nitride.

14. A method in accordance with claim 11 wherein said buried conductors are formed by ion implanting phosphorous N+ dopant with an energy between about 60 keV and about 120 keV, and a dose within a range of doses between about $5 \times 10^{14}$ atoms/cm$^2$ and about $5 \times 10^{15}$ atoms/cm$^2$.

15. A method in accordance with claim 11 wherein said gate oxide has a thickness between about 60 Å and about 200 Å.

16. A method in accordance with claim 11 wherein said conformal conductors have a thickness between about 1,000 Å and about 5,000 Å.

17. A method in accordance with claim 16 wherein said gate oxide has a thickness between about 60 Å and about 200 Å formed by thermal oxidation performed at a temperature between about 800° C. and about 900° C.

18. A method in accordance with claim 14 wherein said buried conductors comprise buried bit lines implanted into said substrate with phosphorus (P) N+ dopant with an energy of about 100 keV, and a dose of P of about $2 \times 10^{15}$/cm$^2$.

19. A method in accordance with claim 18 wherein said field oxide regions have an overall thickness of about 6,000 Å.

20. A method in accordance with claim 19 wherein said conformal conductors have a thickness between about 1,000 Å and about 5,000 Å.

\* \* \* \* \*